United States Patent
Grodzki

(10) Patent No.: US 10,281,546 B2
(45) Date of Patent: May 7, 2019

(54) METHOD AND APPARATUS FOR OPTIMIZING A MAGNETIC RESONANCE CONTROL SEQUENCE

(71) Applicant: Siemens Healthcare Gmbh, Erlangen (DE)

(72) Inventor: David Grodzki, Erlangen (DE)

(73) Assignee: Siemens Healthcare GmbH, Erlangen (DE)

( * ) Notice: Subject to any disclaimer, the term of this patent is extended or adjusted under 35 U.S.C. 154(b) by 160 days.

(21) Appl. No.: 15/381,337

(22) Filed: Dec. 16, 2016

(65) Prior Publication Data

US 2017/0176561 A1    Jun. 22, 2017

(30) Foreign Application Priority Data

Dec. 17, 2015  (DE) .................... 10 2015 225 546

(51) Int. Cl.
| | |
|---|---|
| *G01R 33/54* | (2006.01) |
| *G01R 33/385* | (2006.01) |
| *G01R 33/48* | (2006.01) |
| *G01R 33/565* | (2006.01) |

(52) U.S. Cl.
CPC ......... *G01R 33/543* (2013.01); *G01R 33/385* (2013.01); *G01R 33/3854* (2013.01); *G01R 33/482* (2013.01); *G01R 33/56518* (2013.01)

(58) Field of Classification Search
CPC ............... G01R 33/543; G01R 33/385; G01R 33/3854; G01R 33/482; G01R 33/56518
See application file for complete search history.

(56) References Cited

U.S. PATENT DOCUMENTS

| | | | |
|---|---|---|---|
| 5,512,825 A | 4/1996 | Atalar et al. | |
| 2008/0024129 A1 | 1/2008 | Heid | |
| 2013/0271139 A1* | 10/2013 | Grodzki ............... | G01R 33/543 324/314 |
| 2014/0232396 A1 | 8/2014 | Grodzki et al. | |
| 2015/0212179 A1 | 7/2015 | Overall et al. | |

* cited by examiner

*Primary Examiner* — G. M. A Hyder
(74) *Attorney, Agent, or Firm* — Schiff Hardin LLP

(57) ABSTRACT

In magnetic resonance tomography apparatus and operating a method, a magnetic resonance control sequence with a dynamic magnetic field gradient is optimized in computer, based on an image basis and a gradient basis. A basis transformation of the dynamic magnetic field gradient from the image basis into the gradient basis is implemented, and the dynamic magnetic field gradient in the gradient basis is optimized and is emitted from the computer in an optimized magnetic resonance control sequence.

10 Claims, 4 Drawing Sheets

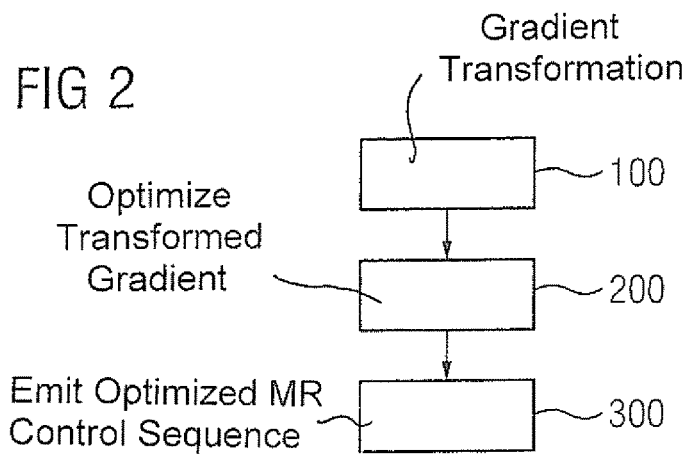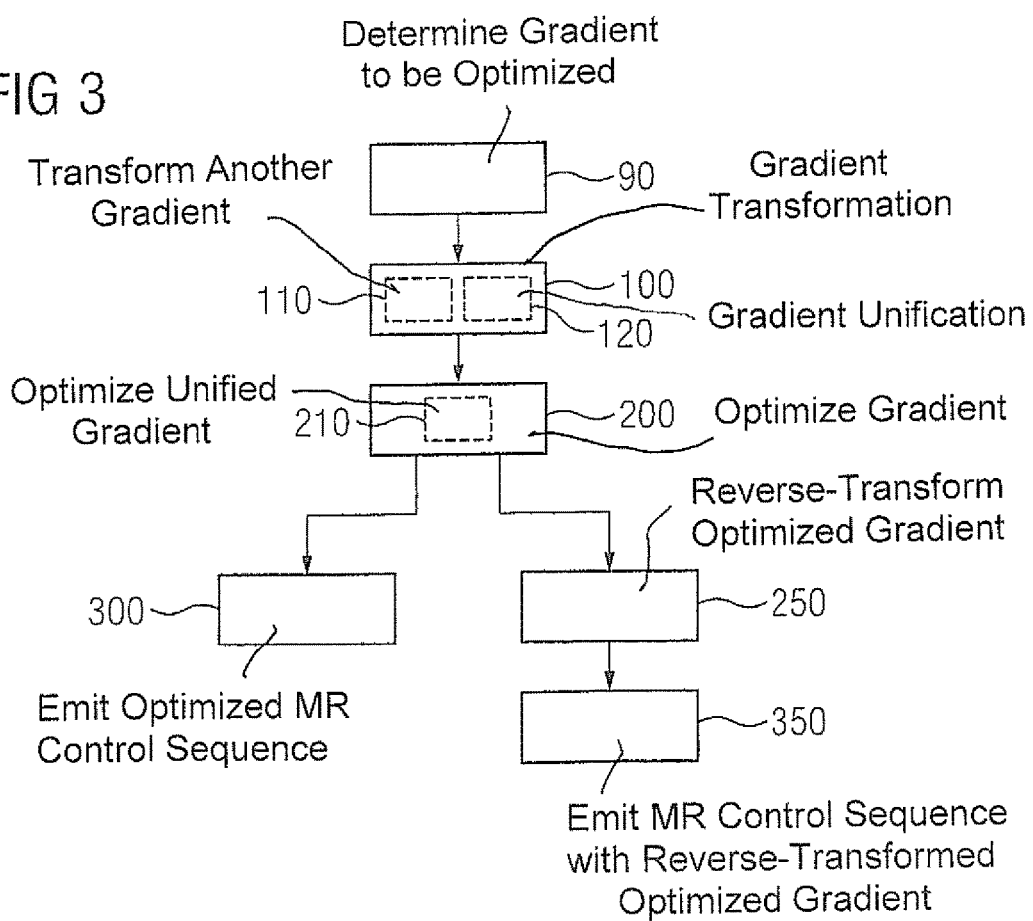

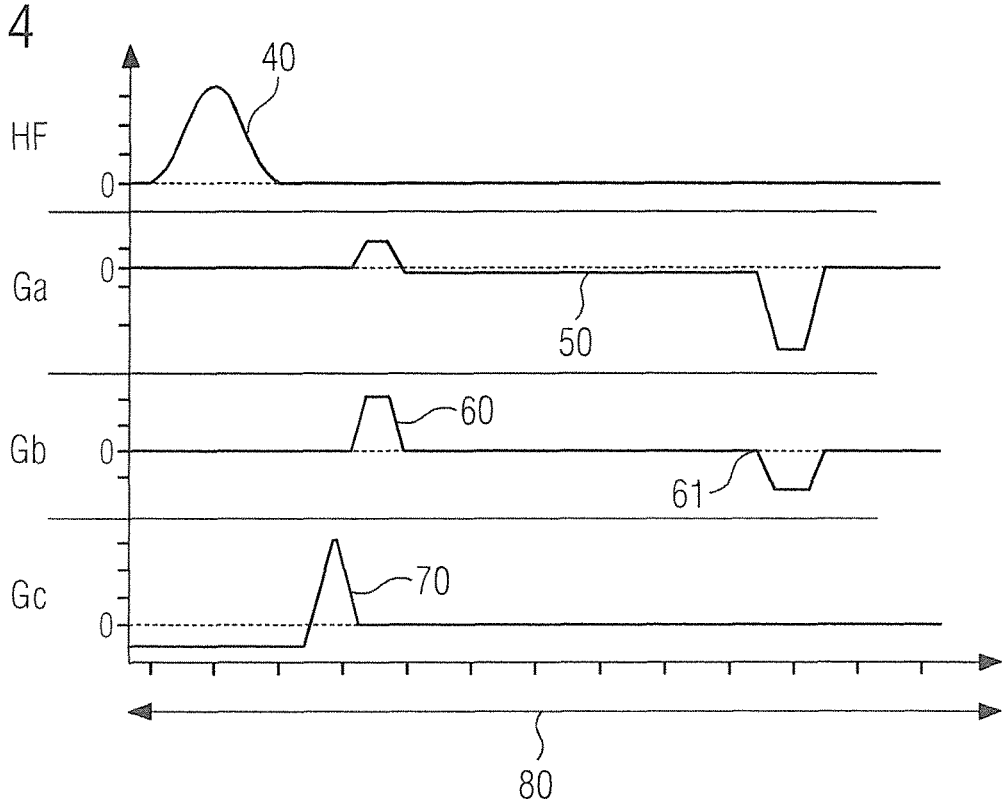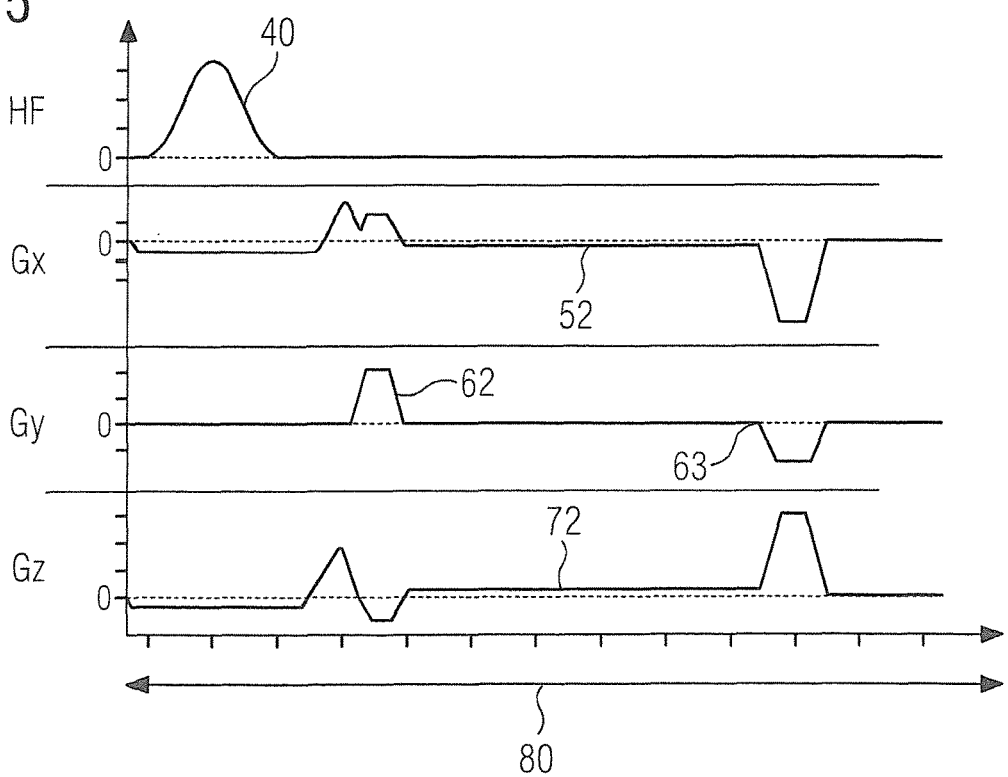

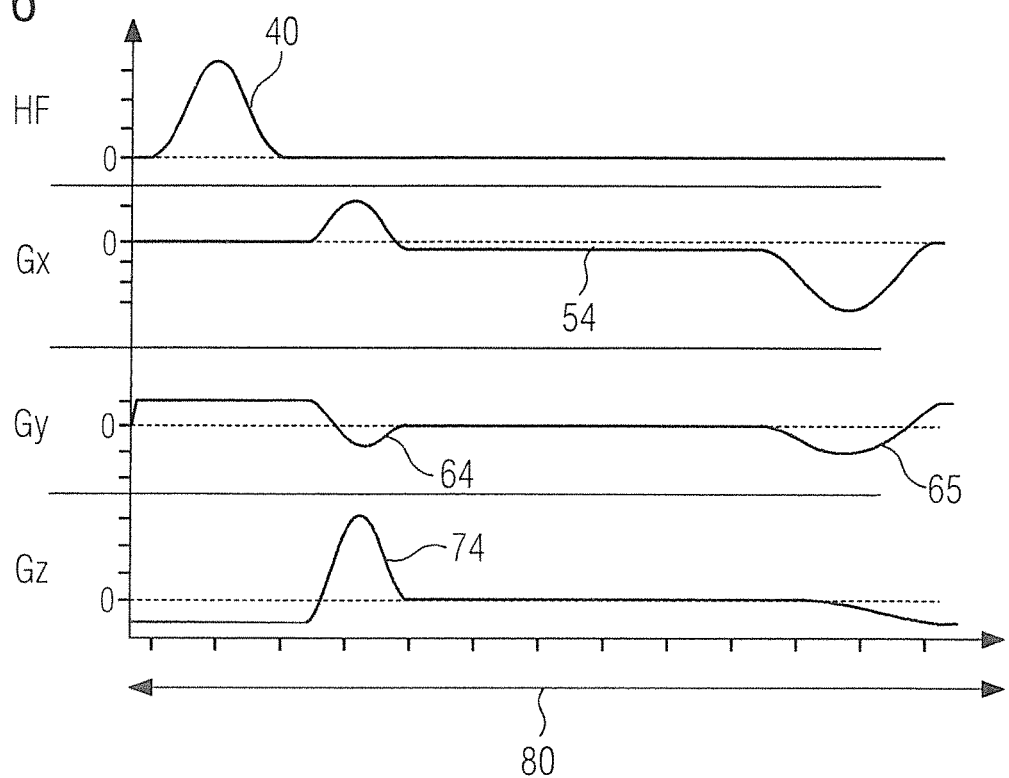

METHOD AND APPARATUS FOR OPTIMIZING A MAGNETIC RESONANCE CONTROL SEQUENCE

BACKGROUND OF THE INVENTION

Field of the Invention

The present invention concerns a method for optimizing a magnetic resonance control sequence, as well as a computer, a magnetic resonance apparatus and a storage medium configured to implement such a method.

Description of the Prior Art

In a magnetic resonance apparatus, the examination object, for example, a patient, is exposed to a relatively strong magnetic field of, for example, 1.5 or 3 Tesla, with the use of a basic field magnet. In addition, a magnetic field gradient is applied by gradient coils. A radio frequency antenna unit, using suitable antenna devices, emits radio frequency excitation signals (RF signals), that cause nuclear spins of particular atoms to be excited into resonance by this high frequency field and thus to be tilted through a defined flip angle relative to the magnetic field lines of the basic magnetic field. During relaxation of the excited nuclear spin, radio frequency signals known as magnetic resonance signals are emitted and are received by suitable receiving antennae and then further processed. From the raw data thereby acquired, the desired image data can be reconstructed.

For a particular measurement, therefore, a specific magnetic resonance control sequence, also known as a pulse sequence, must be transmitted by the gradient coils and the RF antennae. Such a sequence is composed of a series of radio frequency pulses, in particular excitation pulses and refocusing pulses, as well as gradient pulses that are emitted suitably coordinated therewith. The gradient pulses generate dynamic magnetic field gradients in different spatial directions and are used for spatially encoding the magnetic resonance signals. Temporally adapted thereto, readout windows must be set that specify the time frames within which the induced magnetic resonance signals are acquired. Of particular importance for the imaging is the timing within the sequence, that is, the temporal intervals at which pulses follow one another. A large number of the control parameters are typically defined in a so-called scan protocol which is created in advance and can be called upon for a particular measurement, for example, from a memory and, if necessary, can be adjusted by the user on site, who can specify additional control parameters such as a particular slice increment of a batch of slices to be scanned, a slice thickness, etc. Then, based on all these control parameters, a magnetic resonance control sequence is calculated in the control computer of the magnetic resonance apparatus.

The gradient pulses and the corresponding magnetic field gradients are defined by the gradient amplitude G, the pulse duration, and the edge steepness or the first derivative dG/dt of the pulse form, which is the shape over time of the gradient amplitude, usually designated the "slew rate". A further important gradient variable is the magnetic moment also called the gradient moment, which is defined as the integral of the gradient amplitude over time.

During a magnetic resonance control sequence, the gradient coils, by which the gradient pulses are emitted, are switched frequently and rapidly. Since the time pre-selections within a magnetic resonance control sequence are mostly very strict, and the overall duration of a magnetic resonance control sequence, which determines the overall duration of an examination, must be kept as small as possible, gradient amplitudes of approximately 40 mT/m and slew rates of up to 200 mT/m/ms must sometimes be achieved. Such a high edge steepness contributes to the known noise manifestations during switching of the gradients. Eddy currents in other components of the magnetic resonance device, in particular the radio-frequency shield, are a reason for this noise nuisance. In addition, steep flanks of the gradients lead to a higher energy usage and also place greater demands on the gradient coils and other hardware. The rapidly changing magnetic field gradients lead to distortions and oscillations in the gradient coils and to the transference of these energies to the scanner housing. Due to heating of the coils and the other components, a high degree of helium boil-off can also occur, if the basic field magnet has helium-cooled superconducting coils.

To reduce the noise nuisance, various solutions have been proposed regarding the construction of the hardware, such as encapsulation or vacuum-sealing the gradient coils, and optimization processes for magnetic resonance control sequences.

SUMMARY OF THE INVENTION

An object of the invention is to provide a method for optimization of a magnetic resonance control sequence wherein a dynamic magnetic field gradient is modified. It is a further object of the invention to provide a computer, a magnetic resonance apparatus and a non-transitory, computer-readable data storage medium that are configured to implement such a method.

The method according to the invention for optimizing a magnetic resonance control sequence with an image basis with image basis vectors, with a gradient basis with gradient basis vectors, and with a dynamic magnetic field gradient along an image basis vector of the image basis vectors, includes the following steps.

A basis transformation of the dynamic magnetic field gradient from the image basis into the gradient basis is implemented in a computer, so a transformed magnetic field gradient is generated. The transformed magnetic field gradient is optimized in the computer in the gradient basis based on a pre-set optimization criterion, so an optimized magnetic field gradient is generated. The optimized magnetic resonance control sequence, which includes the optimized magnetic field gradient, is emitted from the computer in electronic form with a format for operating a magnetic resonance scanner.

Gradient pulses and thus the magnetic field gradients are generated and emitted by at least one gradient coil. Clinical magnetic resonance scanners can typically generate magnetic field gradients in three spatial directions, wherein the spatial directions are pre-determined by the position and configuration of the, typically three, gradient coils. The three spatial directions are typically orthogonal to one another, are designated gradient basis vectors and define a gradient basis (coordinate system or spatial framework). Typically, they describe the horizontal, the vertical and a direction perpendicular thereto, which extends parallel to the basic magnetic field of the magnetic resonance scanner. For the generation of a single magnetic field gradient in one of these three directions, a gradient pulse with a maximum gradient amplitude can be generated by the appropriate gradient coil.

In the magnetic resonance imaging process, raw data for an image are usually acquired in the form of cuboid or cylindrical volumes, the orientation of which is typically not adapted to a gradient basis vector of the gradient basis, but to the anatomy of the patient. The axes of symmetry of the volume are preferably orthogonal to one another and form the image basis vectors of an image basis. The basis transformation describes how the gradient basis arises from the image basis. The basis transformation can be a rotation. This applies particularly if at least one gradient basis vector is not precisely parallel to an image basis vector. In addition, the basis transformation can be a translation. This applies particularly if the geometric center of the volume to be imaged is not in the isocenter of the at least one gradient coil. The method according to the invention is preferably carried out if the gradient basis does not match the image basis.

In the selective magnetic resonance imaging, a distinction is typically made between the readout direction, the slice selection direction and the phase coding direction, which define the coding schemes according to the magnetic resonance control sequence along the three image basis vectors.

The planning of magnetic resonance control sequences typically takes place in the image basis. In the image basis, the individual magnetic field gradients are aligned along the image basis vectors and on visualization of the timing of a magnetic resonance control sequence in the image basis, the observer can obtain a rapid overview of their functioning and temporal interaction. If a user of the magnetic resonance device specifies a change, relating for example to the timing or a magnetic field gradient of a magnetic resonance control sequence, then typically the change is implemented by a computer of the magnetic resonance apparatus in the image basis and, if relevant, initiates further changes relating to the magnetic resonance control sequence. Herein, the computer typically operates in the image basis.

Typically, gradient pulses generate magnetic field gradients along or parallel to image basis vectors and a function or a task within the magnetic resonance control sequence can be assigned to each gradient pulse, particularly in Cartesian magnetic resonance imaging. Examples of such a function are slice selection or phase encoding. The shape over time of the gradient pulses is reflected in the temporal shape of the amplitude of the magnetic field gradients.

In the final operation of the magnetic resonance scanner in which an image of the examination object, for example, a phantom, a test person or a patient, is generated, the gradient coils are operated so as to generate the pre-determined magnetic field gradients along the image basis. The pre-determined amplitude sequences over time of the gradients in the image basis are typically transferred into the gradient basis, so that they can be activated by the gradient coils of the magnetic resonance scanner. This transformation is usually carried out by the gradient controller for which the relation between the image basis and the gradient basis required therefor is available, usually in the form of a matrix. The matrix can be made available to other control processor of the magnetic resonance apparatus for further calculations. The image basis can thus be selected by a user of the magnetic resonance apparatus independently of the gradient basis. For the activation of a magnetic field gradient along an image basis vector, the operation of magnetic field gradients along at least two gradient basis vectors is required, provided the basis transformation includes a rotation. This typically means that at least two gradient coils are used for the activation.

A magnetic resonance control sequence serves as the starting point of the method, having a dynamic magnetic field gradient along an image basis vector, that is, parallel to an image basis vector.

The dynamic magnetic field gradient is temporary in accordance with its initiating gradient pulse, and thus has a limited duration and is preferably characterized in that its amplitude is zero at the start and end of the duration. Within this duration, the dynamic magnetic field gradient preferably has a variable amplitude. Consequently, the magnetic field gradient has a variable vector length, but a constant direction, which is defined by the image basis vector. The duration can also be designated the time interval.

It has been established that the efficiency of an optimization of a magnetic resonance control sequence is strongly dependent on the properties of the magnetic resonance control sequence to be optimized. It has also been recognized that the selected imaging volume, which defines the image basis and in particular its orientation, influence the efficiency of an optimization of dynamic magnetic field gradients.

In a first method step, which can be carried out by the optimizing computer, a basis transformation of the dynamic magnetic field gradient from the image basis into the gradient basis is implemented. The spatial relation between the image basis and the gradient basis can be known for this and, for example, stored in a database in a storage unit or a computer. The database can make the relation available to the optimizing unit or the optimizing computer can access information from the database. Alternatively, the spatial relation between the image basis and the gradient basis can be determined. The gradient basis is application-independent and is usually given for a magnetic resonance device. Depending on the volume to be imaged which is defined by the magnetic resonance control sequence provided, a computer of the magnetic resonance apparatus can determine an imaging function for the basis transformation and make it available to the optimizing unit. Typically for this, simple mathematical calculations are required. A further unit, for example the gradient controller, can also make this imaging function available to the optimizing computer, for example, in the form of a matrix.

The optimizing computer carries out the basis transformation of the dynamic magnetic field gradient. Following the basis transformation, the resultant transformed magnetic field gradient can be described as a linear combination of at least two gradient basis vectors, provided the gradient basis and the image basis do not convert into one another by a translation. The shape over time of the coordinates of the transformed magnetic field gradients in the gradient basis defines the amplitude sequence that the individual gradient coils create during the activation of the magnetic resonance control sequence.

In a second method step, an optimization of the transformed magnetic field gradient in the gradient basis is carried out. Herein, a pre-determined optimization criterion is taken into account. Two or more optimization criteria which are to be taken into account in the optimization can also be pre-determined. Given the existence of more than one optimization criterion, these should be selected so that all the pre-determined optimization criteria can be fulfilled during the optimization and/or preferably prioritized. A prioritization of the optimization criteria specifies in which order and/or with what importance the optimization criteria are to be fulfilled during the optimization.

An optimization criterion can specify, for example, a target of the optimization. Examples of targets which an optimization criterion can pursue are:
  configuring the activation of the magnetic resonance control sequence to be quieter,
  reducing the energy consumption,
  reducing eddy currents.

Typically, every switching process of a gradient coil induces an eddy current in a conductive structure that is positioned sufficiently close to the gradient coil that the magnetic field changes can induce an electric current in the structure. Eddy currents can themselves create rotational magnetic fields which can impair the homogeneity of the magnetic fields during imaging and can thus reduce the image quality of the resultant images.

Furthermore, an optimization criterion can specify a limit condition, which is to be complied with during the optimization. An optimization criterion comprising a limit condition preferably exists in addition to an optimization criterion which specifies an optimization target. For an optimization, two or more optimization criteria that specify limit conditions can also be pre-determined. By the stipulation of a limit condition, it is ensured that the optimized magnetic resonance control sequence that includes the optimized magnetic field gradient can be activated. Furthermore, by the stipulation of limit conditions, it can be ensured that during the optimization, no changes are undertaken that have undesirable effects, for example, on the recording time or the image quality.

Since during the optimization, typically only the time interval which encompasses the dynamic magnetic field gradient is observed and the remaining part of the magnetic resonance control sequence remains in the originally provided form and thus is not adjusted, limit conditions regarding the duration of the optimized magnetic field gradient are conceivable. Similarly, limitations of the hardware due to limit conditions can be laid down in an optimization criterion. Thus, by means of an optimization criterion, a maximum amplitude or a maximum slew rate for a magnetic field gradient can be prepared and taken into account during the optimization.

The optimization is preferably carried out separately for each coordinate of the transformed magnetic field gradient in the gradient basis in the selected time interval, that is, independently of the other coordinates in the gradient basis. The optimization is preferably carried out by a computer to which input parameters are available and/or are transferred via an input interface. Such input parameters typically impart starting values and/or instructions for the optimization, that is for example, the shape over time of an amplitude of a magnetic field gradient along a gradient basis vector and/or at least one optimization criterion. Furthermore, algorithms for the optimization can be provided to the computer or the computer can access algorithms that specify, for example, how an optimization can be carried out on the basis of the input parameters and/or the optimization criteria. The use of the algorithms on the input parameters typically involves calculations. Following completion of the optimization, typically a coordinate of a magnetic field gradient along a gradient basis vector, this coordinate being optimized on the basis of at least one optimization criterion, is present in the gradient basis and can be identified as the starting parameter of the optimization.

The optimization of two coordinates along two gradient basis vectors can take place separately or simultaneously. The aim of the optimization is preferably the best possible fulfillment of the at least one optimization criterion.

Following completion of the optimization, the third method step takes place, the activation of the optimized magnetic resonance control sequence. The optimized magnetic resonance control sequence includes the optimized magnetic field gradient, whereas components of the magnetic resonance control sequence that lie outside the time interval that encompasses the dynamic magnetic field gradient are preferably retained and activated in the original form. The optimized magnetic resonance control sequence includes, in particular, the optimized magnetic field gradient in place of the original magnetic field gradient. The duration of the time interval is preferably not affected by the optimization.

The emission (output) of the optimized magnetic resonance control sequence can mean that the magnetic resonance scanner is controlled so as to operate the gradient unit and the radio frequency antenna unit according to the stipulation of the optimized magnetic resonance control sequence, and start the scan. For this purpose, the optimizing computer can transfer the optimized magnetic resonance control sequence to the control computer of the magnetic resonance device and directly thereafter the recording of the examination object can take place. In this case, the operation consequently means that current is immediately induced in the gradient coils and RF and magnetic field gradients are generated according to the optimized magnetic resonance control sequence.

The emission can also be a transmission of the optimized magnetic resonance control sequence by the optimizing computer, so that the result of the optimization can be made available to further units, such as the gradient controller or the magnetic resonance apparatus and can be used thereby. The point in time of the use of the optimized magnetic resonance control sequence does not have to be known or decided. This form of emission typically exists when the optimizing computer is not integrated into the magnetic resonance apparatus and/or the preceding method steps are carried out on the basis of the original magnetic resonance control sequence, wherein the operation of a magnetic resonance device, namely a scan with the optimized magnetic resonance control sequence, is to take place at a later point in time. Preferably, the optimized magnetic resonance control sequence is made available not only to one but to further magnetic resonance apparatuses.

The method according to the invention is not restricted to the optimization of one magnetic field gradient of a magnetic resonance control sequence. Rather, the first and the second method step can be carried out for time intervals encompassing a number of magnetic field gradients before the emission of the optimized sequence.

The method according to the invention offers, among other advantages, the advantage that due to the optimization of the magnetic resonance control sequence in the gradient basis, the effectiveness or the efficiency of the optimization depends less on the position or the orientation of the examination region than for an optimization in the image basis and subsequent playing out of the magnetic resonance control sequence in the gradient basis. Consequently, the optimization result is less strongly dependent on the individual scan. The optimization criteria are better fulfilled during playing out of the magnetic resonance control sequence since the optimization takes place in the basis in which the magnetic field gradients are finally played out. The method is advantageous if the gradient basis and the image basis differ strongly and/or if the amplitude sequence of the magnetic field gradients changes severely during the basis transformation from the image basis into the gradient basis.

If, for example, during activation a softer shape of the gradient amplitude along all the gradient basis vectors is desired than the magnetic resonance control sequence has in the originally prepared form after transformation into the gradient basis, then the fulfillment of the optimization criterion in the image basis is not useful. If the optimization according to the optimization criterion has been carried out in the image basis, then through the transformation into the gradient basis in which the final playing out of the magnetic field gradient takes place, the shape over time of the gradient amplitude would be adjusted. Severe changes could be expected if the image basis were derived from the gradient basis by rotation.

In an embodiment of the method, the magnetic resonance control sequence has, in addition to the dynamic magnetic field gradient, a further dynamic magnetic field gradient along a further image basis vector of the image basis vectors, which is basis transformed and optimized and following the optimization is played out at least partially simultaneously with the optimized magnetic field gradient.

A magnetic resonance control sequence typically has more than one magnetic field gradient, wherein different magnetic field gradients can overlap at least partially along different image basis vectors. If a further dynamic magnetic field gradient overlaps the dynamic magnetic field gradient, this means that the two dynamic magnetic field gradients are activated at least partially simultaneously. The further dynamic magnetic field gradient is oriented along a further image basis vector which is preferably unlike the image basis vector to which the dynamic magnetic field gradient is oriented and the method according to the invention can be broadened to an optimization onto the further dynamic magnetic field gradient.

Similarly to the optimization of a dynamic magnetic field gradient, the further dynamic magnetic field gradient is initially present in the image basis. The further dynamic magnetic field gradient describes the shape over time of the gradient amplitude along a further image basis vector. Similarly, a time period is allocated to the further dynamic magnetic field gradient and there exists a further time interval which encompasses the further dynamic magnetic field gradient. The optimizing unit can select this further time interval and transform the shape over time of the gradient amplitude within the further time interval from the image basis into the gradient basis. The resulting further transformed magnetic field gradient can be optimized similarly to the transformed magnetic field gradient on the basis of a pre-set optimization criterion. The optimization criterion taken into account can differ from the optimization criterion which is used for the optimizing of the transformed magnetic field gradient, or can be the same. The number of optimization criteria taken into account for the optimizing of the two transformed magnetic field gradients can be the same or different. Typically, the same optimization criteria apply for the optimizations.

The optimizing of the further transformed magnetic field gradients takes place in the gradient basis. Typically, following the conclusion of the optimizing of both magnetic field gradients in the original magnetic resonance control sequence, the magnetic field gradients encompassed by the time interval and the further time interval and used for the optimization are replaced by both the optimized magnetic field gradients. Subsequently, the activation of the magnetic resonance control sequence including both the optimized magnetic field gradients takes place, with the optimized magnetic field gradients being activated at least partially simultaneously according to the overlap of both time intervals.

If only one dynamic magnetic field gradient is optimized in the gradient basis although it at least partially temporally overlaps with another magnetic field gradient, the optimized magnetic field gradient also overlaps in the gradient basis with the non-optimized magnetic field gradient. The possible superposition along at least one gradient basis vector would then typically lead thereto that the optimization criteria along this gradient basis vector are not fulfilled.

In another embodiment of the method, the magnetic resonance control sequence has, in addition to the dynamic magnetic field gradient, a further dynamic magnetic field gradient along a further image basis vector of the image basis vectors. The basis transformation of the dynamic magnetic field gradient transforms the further dynamic magnetic field gradient from the image basis into the gradient basis and a unified magnetic field gradient is generated in the gradient basis. The optimizing of the transformed magnetic field gradient is then an optimizing of the unified magnetic field gradient.

At the start of the method according to this embodiment, a dynamic magnetic field gradient and a further dynamic magnetic field gradient are present that temporarily overlap in the image basis. Preferably, the two magnetic field gradients are aligned along different image basis vectors.

The further time interval that defines a portion of the shape over time of the magnetic resonance control sequence encompassing the further dynamic magnetic field gradients can consequently overlap at least partially with the time interval which encompasses the dynamic magnetic field gradient. The two time intervals can also be equal, or one can encompass the other. The union of the two time intervals can be designated the overall time interval. In the following method, the dynamic magnetic field gradients are observed within the overall time interval. Preferably, these are precisely the two dynamic magnetic field gradients described above. Further magnetic field gradients can be present in the overall time interval and are taken into account similarly to the further dynamic magnetic field gradient in the following method.

Preferably, the overall time interval is selected and a basis transformation of both the dynamic magnetic field gradients is undertaken, the underlying function which describes the basis transformation matching for both dynamic magnetic field gradients. If the two magnetic field gradients are aligned in the image basis along different image basis vectors, then this distinction can disappear due to the basis transformation in the gradient basis. If the basis transformation is a rotation, then a magnetic field gradient can typically be described along at least two gradient basis vectors. Due to the temporal overlap of the two magnetic field gradients, they can become overlaid in the gradient basis, so that for at least one gradient basis vector, a superposition of magnetic field gradients, which originally existed along different image basis vectors, can occur.

The unified magnetic field gradient arises by a superposition of the basis transformed portions of the dynamic magnetic field gradient and the basis transformed portions of the further dynamic magnetic field gradient. The unified magnetic field gradient therefore typically encompasses the magnetic field gradients lying within the overall time interval in the gradient basis. The optimizing of the unified magnetic field gradient can be carried out similarly to the optimizing of the transformed magnetic field gradient in the gradient basis, that is, similarly to the second method step.

Independently of a possible superposition along a gradient basis vector, an optimizing of the unified magnetic field gradient is preferably carried out separately for the shape over time of the amplitude of the unified magnetic field gradient along each gradient basis vector. The optimizing therefore typically relates to the respective shape over time of the magnetic field amplitude along a gradient basis vector and preferably takes account of no further coordinates of the unified magnetic field gradient. The optimizing of the different coordinates of the unified magnetic field gradient can take place separately, that is, individually or simultaneously. During the optimizing of the coordinates of the unified magnetic field gradient, the same or different optimization criteria can be taken into account and, following conclusion of the optimizing, an optimized unified magnetic field gradient preferably exists.

Since the optimizing relates to the unified magnetic field gradient and is carried out in the gradient basis, the optimized unified magnetic field gradient exists in the form in which the gradient coils are operated. Following the optimization, preferably no further overlaying or superposition with magnetic field gradients not yet taken into account in the optimization takes place. Consequently, during the optimization, it is preferably ensured that the shape over time of the amplitudes of the magnetic field gradients fulfills the optimization criteria along all the gradient basis vectors and can be activated in this form. The optimizing of the unified magnetic field gradient is typically not followed by any superposition of further magnetic field gradients before its activation, so that the optimization result cannot be negatively influenced.

During the optimization, the overall time interval typically remains unaltered. Preferably, the optimization takes place such that also the gradient moments to be generated in the time interval and the further time interval are kept constant.

The optimized unified magnetic field gradient is subsequently played out in the context of a magnetic resonance control sequence comprising the optimized unified magnetic field gradient.

The advantage of the use and optimization of a unified magnetic field gradient lies therein that two or more at least partially simultaneously played out magnetic field gradients can be optimized together, so that the optimization criteria can be better achieved.

In a further embodiment of the method, the dynamic magnetic field gradient to be optimized is determined on the basis of at least one selection criterion from the following list:
 a shape over time of the amplitude of the dynamic magnetic field gradient,
 a slew rate of the dynamic magnetic field gradient,
 simultaneous components of the magnetic resonance control sequence.

Magnetic resonance control sequences typically have a number of dynamic magnetic field gradients. In principle, for each dynamic magnetic field gradient, the method according to the invention for optimization can be used, wherein the method is repeated accordingly for each magnetic field gradient.

It is advantageous to select individual magnetic field gradients and to optimize the magnetic resonance control sequence in that the magnetic field gradients are replaced in the corresponding time intervals by optimized magnetic field gradients. Furthermore, for different magnetic field gradients, for example, different optimization criteria can be used. Preferably, the selection criterion for magnetic field gradients to be optimized also reflects the optimization criterion which is taken into account in the optimization. Two or more selection criteria can also be taken into account in the selection.

The selection criterion is preferably available to the optimizing computer which, on the basis of the selection criterion, selects the magnetic field gradient to be optimized. The optimizing computer can make the selection preferably on the basis of the at least one selection criterion.

A typical selection criterion is the shape over time of the amplitude of the dynamic magnetic field gradient, that is the envelope of the gradient pulse. For example, it can be selected as the criterion that it should be different from zero. Thus, for example, a magnetic field gradient can be detected.

A further selection criterion can be the slew rate of the dynamic magnetic field gradient. The slew rate of a magnetic field gradient is typically a measure for the loading of gradient coils. Similarly, with a higher slew rate, the rotational fields and/or the loudness during a magnetic resonance scan can increase. It is advantageous to specify as a selection criterion a boundary value for the slew rate, so that a magnetic field gradient with a slew rate exceeding the boundary value is selected and optimized.

As a further selection criterion, simultaneous components of the magnetic resonance control sequence can be used. Magnetic resonance control sequences have RF and gradient pulses along different axes, which follow a strict timing and partially overlap. Consequently, based upon simultaneous components of magnetic resonance control sequences and the timing, properties of the magnetic field gradients can be deduced.

Further selection criteria that appear appropriate to those skilled in the art are also conceivable.

The optimizing computer selects magnetic field gradients according to at least one of the preceding selection criteria. Depending on the selection criterion that is chosen, it can be advantageous to apply the selection criterion to the magnetic field gradient in the image basis and/or the gradient basis. It is thus advantageous, in particular for the analysis of the shape over time of the amplitude of the dynamic magnetic field gradient or for the analysis of the slew rate, to observe the magnetic field gradients in the gradient basis that are to be played out by the gradient unit. Consequently, depending on the selection criterion chosen, before the use of the selection criterion, a basis transformation of the magnetic field gradient can be advantageous.

An advantage of this procedure is that, based upon the stipulation of a selection criterion, magnetic field gradients to be optimized can be determined automatically, by which it is ensured that all the magnetic field gradients relevant for an optimization criterion are selected and optimized and the resulting optimized magnetic resonance control sequence fulfills the optimization criterion as well as possible.

In a further advantageous embodiment of the method, during the optimization of the transformed magnetic field gradient, at least one of the following criteria is used as a pre-set optimization criterion in the gradient basis:
 keeping the magnetic moment of the transformed magnetic field gradient constant,
 keeping defined fixed points of the shape over time of the amplitude of the transformed magnetic field gradient constant.

As previously described, optimization criteria can define goals or limit conditions for the optimization which are to be taken into account during the optimization. The optimization criteria that are selected define limit conditions, adherence to which during the optimization ensures that the optimized magnetic resonance control sequence can be activated and the quality of the magnetic resonance images resulting from the scan is preserved.

As the optimization criterion, the condition can be that the magnetic moment of the transformed magnetic field gradient is to be kept constant during the optimization, that is, should not be adjusted by the optimization. The transformed magnetic field gradient is given in the gradient basis, that is in the basis in which the optimization and the activation takes place. By keeping the magnetic moment constant in the gradient basis, it can be ensured, for example, that during activation of the optimized magnetic resonance control sequence, in contrast to the original magnetic resonance control sequence, no phase shift or further effects negatively influencing the image quality occur.

Alternatively or additionally, fixed points of the shape over time of the amplitude of the transformed magnetic field gradient defined in the context of an optimization criterion can be kept constant in the gradient basis. Fixed points are given or defined for the envelopes preferably of all the gradient pulses, preferably along all the gradient basis vectors in the gradient basis that respectively record, for a point in time within a magnetic resonance control sequence, the magnitude of at least one not yet optimized magnetic field gradient occurring at this point in time, preferably along all three gradient basis vectors. The magnitude or magnitudes should not be adjusted by the optimization at the point in time.

The advantage of the selection of such an optimization criterion is that it can be ensured that fundamental properties of the magnetic resonance control sequence are retained during the optimization.

In a further embodiment of the method, following the optimization of the transformed magnetic field gradient and before the activation of the magnetic resonance control sequence, a basis reverse transformation of the optimized magnetic field gradient from the gradient basis into the image basis is carried out, wherein a reverse-transformed optimized magnetic field gradient is generated in the image basis, and is emitted.

The transformed magnetic field gradients are optimized in the gradient basis. The final activation of the associated gradient pulses, that is, the operation of the gradient coils, typically also takes place in the gradient basis. However, it can be advantageous to undertake a reverse transformation of the optimized magnetic field gradient into the image basis. This applies if the optimizing computer can operate independently of the magnetic resonance control sequence and/or during the process of a magnetic resonance scan. This applies, for example, if the optimizing computer can be selected or switched off by a user of the magnetic resonance apparatus and/or the optimizing computer is configured to optimize any desired magnetic resonance control sequence to be activated wherein according to the descriptions above, a magnetic field gradient is selected according to at least one selection criterion and is optimized, taking account of at least one optimization criterion. If a reverse transformation is undertaken following the optimization, the method according to the invention is independent of a conventional method in which a user stipulates a magnetic resonance control sequence and, if relevant, can make adjustments thereto. The method according to the invention, the optimization, therefore represents an intermediate step which can be integrated into the conventional method, provided this is pre-set, for example, by the user.

An advantage of the basis reverse transformation is that the method for optimizing a magnetic resonance control sequence can be integrated as an optional intermediate step in a conventional sequence for planning and/or carrying out a magnetic resonance scan.

In a further embodiment of the method, the optimized magnetic field gradient is activated directly in the gradient basis, once the optimization is present in the gradient basis.

This embodiment of the method according to the invention therefore dispenses with a reverse transformation of the optimized magnetic field gradient into the image basis. Rather, the optimized magnetic field gradients can preferably be integrated in the gradient basis into the magnetic resonance control sequence and emitted in the form of the optimized magnetic resonance control sequence present in the gradient basis directly, that is, without further basis transformation. For this purpose it is advantageous, for the basis transformation of the at least one dynamic magnetic field gradient from the image basis into the gradient basis, to take account not only of the dynamic magnetic field gradients to be optimized, but also all the magnetic field gradients to be activated, which are given by the magnetic resonance control sequence. Accordingly, the overall interval for which the basis transformation is carried out preferably encompasses the whole magnetic resonance control sequence, whereas for the optimizing of individual magnetic field gradients, time intervals that are portions of the overall time interval are selected.

The advantage of the direct activation is that the efficiency of the method is enhanced by the omission of the basis transformation and the basis reverse transformation.

The invention also encompasses an optimizing computer for optimizing a magnetic resonance control sequence of a magnetic resonance device. The optimizing computer has a processor configured to carry out the method according to the invention. The optimizing computer is thus designed to carry out the inventive method for optimizing a magnetic resonance control sequence.

For this purpose, the optimizing computer has a transformation unit that is configured to carry out a basis transformation of a dynamic magnetic field gradient from the image basis into the gradient basis and to generate a transformed magnetic field gradient.

Furthermore, the optimizing computer has a gradient optimizing unit configured to carry out an optimization of the transformed magnetic field gradient in the gradient basis on the basis of a pre-set optimization criterion, and to generate an optimized magnetic field gradient.

The invention enables the optimization of a magnetic resonance control sequence along the coordinate axes along which the activation of the magnetic resonance control sequence takes place. The effectiveness of the optimization, which advantageously optimizes the shape over time of the gradients, is enhanced and the efficiency of the optimization is less strongly dependent on the position and the orientation of the examination region than for an optimization in the image basis. Pre-set optimization criteria can be better achieved, in particular, if the image basis and the gradient basis severely differ from one another, for example, transform into one another by rotation. The optimizing computer can take account in the optimization of the magnetic resonance control sequence of not only one, but a number of dynamic magnetic field gradients, even if they are present temporally overlaid. Advantageously, the optimizing computer is configured to select automatically the dynamic magnetic field gradients to be optimized according to pre-set selection criteria, so that a consistent optimization result can be achieved regardless of the magnetic resonance control sequence given. Similarly, through the selection of optimization criteria, goals of the optimization can be defined or limit conditions for the optimization can be provided so that fundamental properties of a magnetic resonance control sequence cannot be adjusted during the optimization. The optimizing computer can optionally carry out the optimization as an intermediate step of a specification, planning and execution of a magnetic resonance control sequence according to the specification of a user. Alternatively, a direct playing out of the magnetic resonance control sequence in the gradient basis can enhance the efficiency of the invention.

Embodiments of the optimizing computer according to the invention are configured similarly to the embodiments of the method according to the invention. The optimizing computer can have further control components that are necessary and/or advantageous for carrying out a method according to the invention. The optimizing computer can also be configured to transmit control signals to a magnetic resonance apparatus and/or to receive and/or process control signals in order to carry out the method according to the invention. Preferably, the optimizing computer is part of the control computer of the magnetic resonance device and is preferably connected relatively closely upstream of the radio frequency antenna unit and/or the gradient coil unit. In a storage unit of the optimizing computer, computer programs and other software can be stored, by means of which a processor of the optimizing computer automatically controls and/or carries out a method sequence of a method according to the invention.

The magnetic resonance apparatus according to the invention has an optimizing computer. The magnetic resonance apparatus according to the invention is thus configured to carry out the method according to the invention with the optimizing computer. The optimizing computer can be integrated into the magnetic resonance apparatus. The optimizing computer can also be installed separately from the magnetic resonance apparatus. The optimizing computer can be connected to the magnetic resonance apparatus.

The non-transitory, computer-readable data storage medium according to the invention is directly loadable into a memory of a programmable computer of a magnetic resonance apparatus and is encoded with program code in order to cause the method according to the invention to be implemented when the program code is executed in the computer of the magnetic resonance apparatus. In this way, the method according to the invention can be carried out rapidly, exactly reproducibly and robustly. The computer must have the pre-conditions such as a suitable working memory, a suitable graphics card or a suitable logic unit so that the respective method steps can be carried out efficiently.

Examples of electronically readable data storage media are a DVD, a magnetic tape or a USB stick, on which electronically readable control information, in particular software (see above) is stored.

The advantages of the optimizing computer according to the invention, the magnetic resonance apparatus according to the invention and the data storage medium according to the invention substantially correspond to the advantages of the method according to the invention for optimizing a magnetic resonance control sequence, as described in detail above. Features, advantages and alternative embodiments mentioned herein are also applicable to the other aspects of the invention.

BRIEF DESCRIPTION OF THE DRAWINGS

FIG. 2 is a flowchart of an embodiment of the method according to the invention.

FIG. 3 is a flowchart of another embodiment of the method according to the invention.

FIG. 4 is a graph of a magnetic resonance control sequence in the image basis.

FIG. 5 is a graph of a magnetic resonance control sequence in the gradient basis.

FIG. 6 is a graph of an optimized magnetic resonance control sequence in the gradient basis.

DESCRIPTION OF THE PREFERRED EMBODIMENTS

Figure 1:
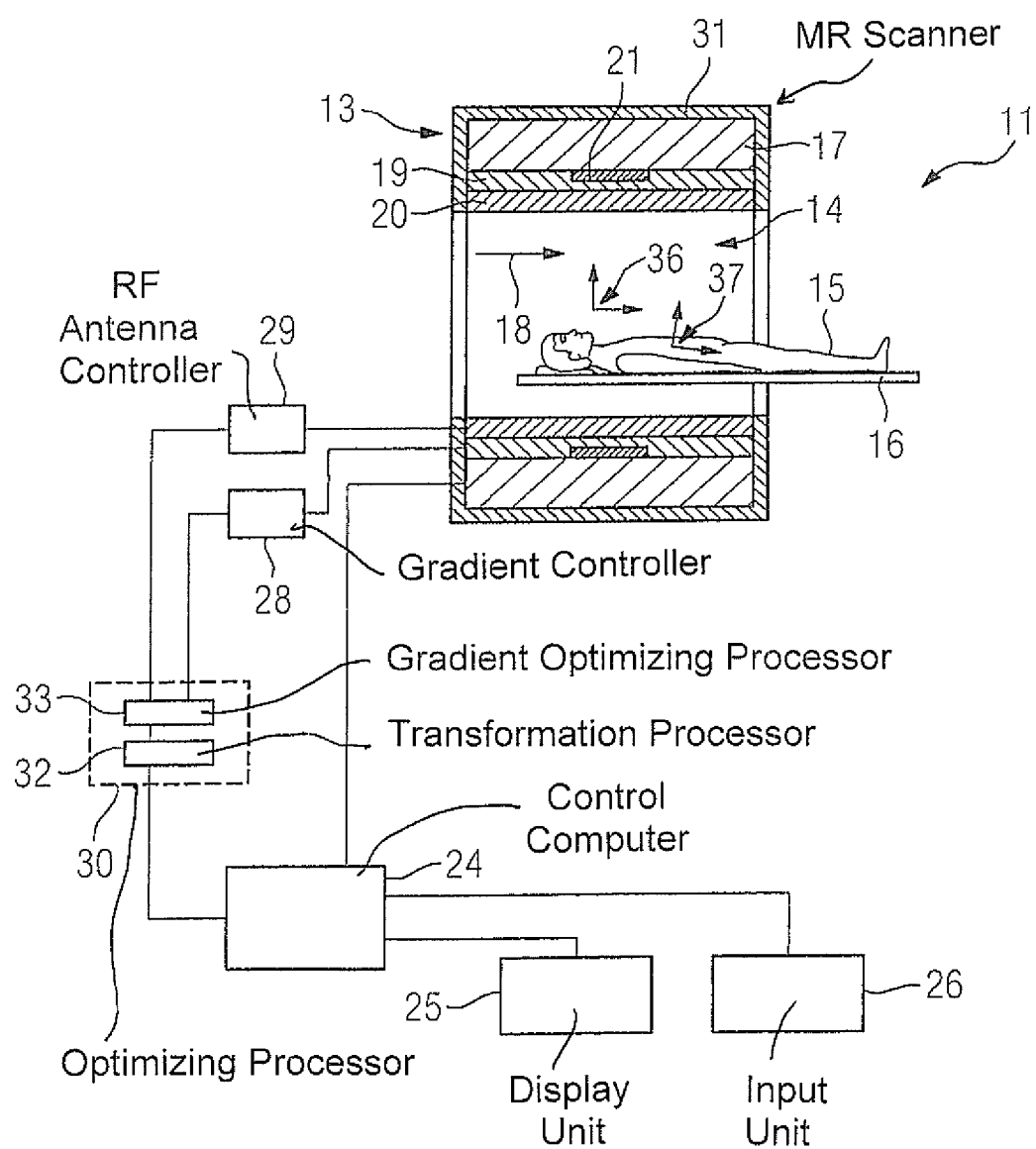
FIG. 1 is block diagram of a magnetic resonance apparatus according to the invention.

FIG. 1 shows a magnetic resonance device 11 according to the invention for implementing the method according to the invention, in a block diagram. The magnetic resonance apparatus 11 has a scanner 13 with a basic field magnet 17 for generating a strong and constant basic magnetic field 18. Furthermore, the magnetic resonance scanner 13 has a cylindrical patient receiving region 14 for accommodating a patient 15. The patient receiving region 14 is cylindrically enclosed in a peripheral direction by the scanner 13. The patient 15 can be moved by a patient support 16 of the magnetic resonance apparatus 11 into the patient receiving region 14. For this purpose, the patient support 16 has a patient table that is movable within the scanner 13. The position and orientation of the portion of the patient 15 that is to be imaged by the magnetic resonance apparatus 11 is defined by the image basis 37. The scanner 13 is screened toward the outside by a housing shell 31.

The scanner 13 also has a gradient coil arrangement 19 with a gradient coil 21 for generating magnetic field gradients that are used for spatially encoding the magnetic resonance signals during imaging. The gradient coil arrangement 19 is operated by a gradient controller 28. Localized in the isocenter of the gradient coil unit 19 is a gradient basis 36 that includes the gradient basis vectors along the magnetic field gradients that are to be generated. Furthermore, the scanner 13 has a radio frequency antenna 20 which, in the case shown, is configured as a body coil firmly integrated into the scanner 13, and a radio frequency antenna controller 29. The radio frequency antenna 20 is operated by the radio frequency antenna controller 29 to radiate radio frequency pulses into an examination space that is substantially formed by the patient receiving region 14. The radio frequency pulses excite certain nuclear spins in the patient 15, so that the magnetization of the excited nuclear spins is deflected from the field lines of the basic magnetic field 18. As the excited nuclear spins relax, they emit radio frequency signals (magnetic resonance signals) that are detected by the radio frequency antenna 20.

For controlling the basic field magnet 17, the gradient controller 28 and the radio frequency antenna controller 29, the magnetic resonance apparatus 11 has a control computer 24. The control computer 24 centrally controls the magnetic resonance apparatus 11, for example, the execution of the magnetic resonance control sequences. Control information such as imaging parameters and reconstructed magnetic resonance images can be displayed for a user on a display unit 25, for example, on at least one monitor of the magnetic resonance apparatus 11. In addition, the magnetic resonance apparatus 11 has an input unit 26 via which information and/or imaging parameters can be entered by a user during a scanning procedure. The control computer 24 can include the gradient controller 28 and/or the radio frequency antenna controller 29 and/or the display unit 25 and/or the input unit 26.

The magnetic resonance apparatus 11 also has an optimizing processor 30 configured to optimize imaging parameters of magnetic resonance control sequences. For this purpose, the optimizing processor 30 has a transformation processor 32, a gradient optimizing processor 33. The magnetic resonance apparatus 11, in particular the optimizing processor 30, is configured to implement the method according to the invention.

The magnetic resonance apparatus 11 can naturally have further components that magnetic resonance apparatuses typically have. The general mode of operation of a magnetic resonance apparatus is known to those skilled in the art, so that a detailed description of the further components and the operation is not necessary herein.

FIG. 2 shows a flowchart of an embodiment of the method according to the invention. The method is carried out in order to adapt a magnetic resonance control sequence to given optimization criteria and to ensure that the optimization criteria are also adhered to when the magnetic resonance control sequence is played out. For this purpose, the following method steps are followed.

The starting point of the method is a magnetic resonance control sequence with a dynamic magnetic field gradient along an image basis vector of the image basis vectors which is present in an original form. The magnetic resonance control sequence can also comprise a further dynamic magnetic field gradient along a further image basis vector, which is taken into account in the further method steps similarly to the dynamic magnetic field gradient. Furthermore, a gradient basis 36 with gradient basis vectors is provided. In the method step 100, a basis transformation of the dynamic magnetic field gradient from the image basis 37 into the gradient basis 36 takes place, wherein a transformed magnetic field gradient is generated, which is present in the gradient basis 36. The method step 100 is preferably carried out by the transformation unit 32. In the method step 200, the optimization of the transformed magnetic field gradient takes place based on a pre-set optimization criterion, wherein an optimized magnetic field gradient is generated. The optimization is carried out by the gradient optimization processor 33 and more than one optimization criterion can also be taken into account during the optimization, provided more than one optimization criterion is provided. Preferably, at least one of the following criteria is used as an optimization criterion:

keeping the magnetic moment of the transformed magnetic field gradient constant,
keeping defined fixed points of the shape over time of the amplitude of the transformed magnetic field gradient constant.

In the method step 300, the emission of the optimized magnetic resonance control sequence which comprises the optimized magnetic field gradient takes place. If the magnetic resonance control sequence has a further dynamic magnetic field gradient that was taken into account in the method steps 100 and 200 similarly to the dynamic magnetic field gradient, then this is preferably also activated during the emission of the optimized magnetic resonance control sequence. If appropriate, the further optimized dynamic magnetic field gradient can be activated at least partially simultaneously with the optimized magnetic field gradient.

FIG. 3 shows a flowchart of a further embodiment of the method according to the invention, wherein the flowchart shown in FIG. 2 is enhanced by further steps.

The starting point of this embodiment the method is similarly a magnetic resonance control sequence with a dynamic magnetic field gradient along an image basis vector of the image basis vectors, which is present in an original form. The magnetic resonance control sequence optionally has a further dynamic magnetic field gradient along a further image basis vector. Given the presence of a further dynamic magnetic field gradient, this can be taken into account in the following method steps as described.

The method begins with method step 90 in which a dynamic magnetic field gradient to be optimized is determined on the basis of a selection criterion provided, wherein at least one selection criterion provided is selected from the following list:

a shape over time of the amplitude of the dynamic magnetic field gradient,
a slew rate of the dynamic magnetic field gradient,
simultaneous components of the magnetic resonance control sequence.

A further dynamic magnetic field gradient can also be selected for the further method, possibly on fulfillment of at least one of the selection criteria provided.

This selection can be carried out, for example, by the optimizing computer 30. Method step 100 follows, wherein a basis transformation of the dynamic magnetic field gradient from the image basis 37 into the gradient basis 36 takes place, wherein a transformed magnetic field gradient is generated. If the further dynamic magnetic field gradient is present, then method step 100 can comprise method step 110, the basis transformation of the further dynamic magnetic field gradient from the image basis 37 into the gradient basis 36 and/or method step 120, the generation of a unified magnetic field gradient in the gradient basis 36.

In the subsequent method step 200, the optimization of the transformed magnetic field gradient takes place on the basis of a pre-set optimization criterion, wherein an optimized magnetic field gradient is generated. If a unified magnetic field gradient is present, method step 200 can comprise method step 210, the optimizing of the unified magnetic field gradient. The resultant optimized magnetic field gradient then typically comprises the optimized unified magnetic field gradient.

Following the optimization, method step 300 can be carried out, wherein the optimized magnetic resonance control sequence, which includes the optimized magnetic field gradient, is emitted. Optionally, following method step 200, method step 250 can also be executed, wherein, following the optimization of the transformed magnetic field gradient and before the playing out of the magnetic resonance control sequence, a basis reverse transformation of the optimized magnetic field gradient from the gradient basis into the image basis is carried out, wherein a reverse-transformed optimized magnetic field gradient is generated in the image basis. The playing out of the reverse-transformed optimized magnetic field gradient can take place in method step 350, wherein, for example, an optimized magnetic resonance control sequence which comprises the reverse-transformed optimized magnetic field gradient is activated.

The method described thus defines an optimization that is largely independent of the relationship of the image basis 37 to the gradient basis 36 and, particularly for images the orientation of which is tilted relative to the gradient basis 36, an improved optimization can be achieved. The aim of the optimization is typically a reduction of the noise, the rotational fields or the energy consumption during a magnetic resonance scan. The method can be used independently of the magnetic resonance control sequence to be optimized.

FIG. 4 shows a graph of a magnetic resonance control sequence which is suitable for recording an examination region, wherein the magnetic field gradients in the image basis 37 are shown. The magnetic resonance control sequence is present in its original form. The horizontal axis represents a temporal sequence, whilst the amplitudes of the RF pulses (HF, 40) and magnetic field gradients are plotted in the vertical direction. The magnetic field gradients are shown along the image basis vectors (Ga, Gb, Gc). The magnetic field gradient 50 along a first basis vector (Ga), the magnetic field gradients 60 and 61 along a second basis vector (Gb) and the magnetic field gradient 70 along a third basis vector (Gc) are present in their original form. The individual magnetic field gradients serve different functions, so that the magnetic field gradient 70 is used for slice selection, the magnetic field gradients 60 and 61 are used for phase encoding and the magnetic field gradient 50 is used as the read-out gradient. The time interval 80 indicates a portion of the shape over time of the magnetic field gradients in which the magnetic field gradients 50, 60, 61 and 70 at least partially overlap. If the magnetic resonance control sequence in the form shown in FIG. 4 is emitted, then the magnetic field gradients 50, 60, 61 and 70 would be at least partially simultaneously activated. The optimizing computer 30 can identify, for example, on the basis of one or more selection criteria provided, the magnetic field gradients 50, 60, 61 and 70 as magnetic field gradients to be optimized. The time interval encompassing these magnetic field gradients is the time interval 80. The image basis 37 defined by the image basis vectors (Ga, Gb, Gc) in which the present magnetic field gradients are given differs, for example, by a rotation about 45° from the gradient basis 36.

FIG. 5 is a graph of a magnetic resonance control sequence in the gradient basis 36. It represents the magnetic resonance control sequence shown in FIG. 4 in the image basis in the gradient basis 36, wherein the image basis 37 is derived from the gradient basis 36 by a rotation through 45°. The shape over time of the amplitudes of the dynamic magnetic field gradients shown in FIG. 4 is basis transformed in FIG. 5, that is, along the gradient basis vectors (Gz, Gy, Gz). The magnetic resonance control sequence has in the image basis 37 the dynamic magnetic field gradient 50 along Ga and the further dynamic magnetic field gradients 60, 61 and 70 along Gb and Gc. In the basis transformation, in addition to the magnetic field gradients 50, the further dynamic magnetic field gradients 60, 61 and 70 are taken into account, so that the resulting magnetic field gradients 52, 62, 63 and 72 together form the unified magnetic field gradient, which is subdivided along the gradient basis vector into the coordinates of the unified magnetic field gradient 52, 62, 63 and 72. The amplitude shapes shown differ from those in the corresponding image basis 37. No unambiguous functional assignment of the magnetic field gradients is possible. For example, the transformed magnetic field gradient 52 encompasses not only contributions of the magnetic field gradient 50, but also dynamic magnetic field gradients 60 and/or 70.

FIG. 6 is a graph of an optimized magnetic resonance control sequence in the gradient basis. Herein, the coordinates within the time interval 80 of the unified magnetic field gradient 52, 62, 63 and 72 are optimized according to at least one pre-set optimization criterion. If the magnetic resonance control sequence is played out in the form shown in FIG. 6, then the optimized magnetic field gradients 54, 64, 65 and 74 would be at least partially simultaneously played out. The optimization of the coordinates of the unified magnetic field gradient 52, 62, 63 and 72 is equivalent to the optimization of the unified magnetic field gradient along the individual gradient basis vectors Gx, Gy and Gz. The optimization typically takes place separately for the individual coordinates of the unified magnetic field gradient in the gradient basis 36.

An optimization criterion taken into account in the optimization is, for example, a smoothing of the shape over time of the amplitudes of the magnetic field gradients. This means that the value of the first derivative of the amplitudes with respect to time is to be reduced. By this means, the noises, the rotational fields and the energy consumption during playing out of the magnetic resonance control sequence are reduced. The optimized magnetic field gradients 54, 64, 65 and 74 have less steep flanks and the shape of the amplitudes is therefore smoother.

The optimization can take place as follows: The first gradient moment within the time interval 80 along each gradient basis vector (Gz, Gy, Gz) is determined and the gradient shape is optimized while maintaining the determined gradient moment within the time interval 80, for example, made smoother. The smoothing can take place, for example, in that a spline of order 4 with the desired gradient moment is determined or used. Furthermore, during the optimization, the second gradient moment can be taken into account. This method step is carried out for all the magnetic field gradients lying within the time interval 80 along the respective gradient basis vectors (Gx, Gy, Gz).

In the gradient basis 36, for example, for the transformed magnetic field gradient 52, there is an irregular shape of the gradient amplitude, in particular with a strongly alternating first derivative. The optimized magnetic field gradient 54 has a smoother amplitude sequence than on the transformed magnetic field gradient 52.

An optimization which is carried out in accordance with the method according to the invention with the pre-set optimization criteria can therefore also be carried out effectively for examination regions the image basis 37 of which differs significantly from the gradient basis 36. Since the method according to the invention is independent of the magnetic resonance control sequence to be optimized, the demands made by the magnetic resonance control sequence on the gradient coil arrangement 19 of a magnetic resonance apparatus 11 can be reduced by the selection of corresponding optimization criteria which can be taken into account in the development of new magnetic resonance devices. Furthermore, lower rotational fields can mean fewer artifacts in the resulting images and a reduction in the loudness can mean an increase in comfort for the patient 15.

Although modifications and changes may be suggested by those skilled in the art, it is the intention of the Applicant to embody within the patent warranted hereon all changes and modifications as reasonably and properly come within the scope of the Applicant's contribution to the art.

The invention claimed is:

1. A method for optimizing a magnetic resonance control sequence, comprising:

providing a processor with a magnetic resonance control sequence, to be used to operate a magnetic resonance data acquisition scanner, comprising a set of gradient coils, so as to acquire magnetic resonance data from an examination subject, said magnetic resonance control sequence causing said data acquisition scanner to operate the set of gradient coils in order to activate a dynamic magnetic field gradient during acquisition of said magnetic resonance data;

in said processor, for said magnetic resonance control sequence, defining an image basis with image basis vectors dependent on anatomy of the examination subject, from which anatomy said magnetic resonance data are to be acquired, and defining a gradient basis with gradient basis vectors conforming to a physical structure and orientation of said gradient coil in said scanner, wherein said dynamic magnetic field gradient proceeds along one of said image basis vectors;

in said processor, implementing a basis transformation of the dynamic magnetic field gradient from the image basis into the gradient basis, and thereby generating a transformed magnetic field gradient;

in said processor, optimizing the transformed magnetic field gradient in the gradient basis based on a pre-set optimization criterion, and thereby generating an optimized magnetic field gradient; and emitting an optimized magnetic resonance control sequence, which comprises the optimized magnetic field gradient, from the processor as an electronic signal formatted to control said magnetic resonance data acquisition scanner to execute the optimized magnetic resonance control sequence.

2. A method as claimed in claim 1 wherein said magnetic resonance control sequence also activates, in addition to said dynamic magnetic field gradient, a further dynamic field gradient that proceeds along another of said image basis vectors and, in said processor, also transforming and optimizing said further dynamic magnetic field gradient to obtain an optimized further magnetic field gradient, and including said optimized further magnetic field gradient in said optimized magnetic resonance control sequence that is emitted by said processor.

3. A method as claimed in claim 2 comprising implementing said basis transformation of said dynamic magnetic field gradient together with a basis transformation of the further dynamic magnetic field gradient, from the image basis into the gradient basis, and thereby generating a unified magnetic field gradient in said gradient basis, and optimizing said unified magnetic field gradient according to said pre-set optimization criterion, thereby generating an optimized unified magnetic field gradient, and including said optimized unified magnetic field gradient in said optimized magnetic resonance control sequence that is emitted by said processor.

4. A method as claimed in claim 1 comprising selecting an attribute associated with said dynamic magnetic field gradient to be optimized when optimizing the transformed magnetic field gradient, and selecting said attribute from the group consisting of a shape over time of an amplitude of the dynamic magnetic field gradient, a slew rate of the dynamic magnetic field gradient, and components of said magnetic resonance control sequence to be activated simultaneously with said dynamic magnetic field gradient.

5. A method as claimed in claim 1 comprising selecting said pre-set optimization criterion from the group consisting of maintaining a magnetic moment of said transformed magnetic field gradient constant, and maintaining defined fixed points of a shape over time of an amplitude of the transformed magnetic field gradient constant.

6. A method as claimed in claim 1 comprising, after optimizing said transformed magnetic field gradient and before emitting the optimized magnetic resonance control sequence, implementing, in said processor, a basis reverse transformation of the optimized magnetic field gradient from the gradient basis into the image basis, and thereby generating a reverse-transformed optimized magnetic field gradient, and including said reverse-transformed optimized magnetic field gradient in said optimized magnetic resonance control sequence.

7. A method as claimed in claim 1 comprising emitting said optimized magnetic field gradient directly in the gradient basis, after optimization in the gradient basis is concluded.

8. An optimizing computer for optimizing a magnetic resonance control sequence, comprising:

a processor provided with a magnetic resonance control sequence, to be used to operate a magnetic resonance data acquisition scanner, comprising a set of gradient coils, so as to acquire magnetic resonance data from an examination subject, said magnetic resonance control sequence causing said data acquisition scanner to operate the set of gradient coils in order to activate a dynamic magnetic field gradient during acquisition of said magnetic resonance data;

said processor being configured, for said magnetic resonance control sequence, to define an image basis with image basis vectors dependent on anatomy of the examination subject, from which anatomy said magnetic resonance data are to be acquired, and to define a gradient basis with gradient basis vectors conforming to a physical structure and orientation of said gradient coil in said scanner, wherein said dynamic magnetic field gradient proceeds along one of said image basis vectors;

said processor being configured to implement a basis transformation of the dynamic magnetic field gradient from the image basis into the gradient basis, and thereby generate a transformed magnetic field gradient;

said processor being configured to optimize the transformed magnetic field gradient in the gradient basis based on a pre-set optimization criterion, and thereby generate an optimized magnetic field gradient; and being configured to emit an optimized magnetic resonance control sequence, which comprises the optimized magnetic field gradient, from the processor as an electronic signal formatted to control said magnetic resonance data acquisition scanner to execute the optimized magnetic resonance control sequence.

9. A magnetic resonance apparatus comprising:

a magnetic resonance data acquisition scanner, comprising a set of gradient coils;

a processor provided with a magnetic resonance control sequence, to be used to operate said magnetic resonance data acquisition scanner so as to acquire magnetic resonance data from an examination subject, said magnetic resonance control sequence causing said data acquisition scanner to operate the set of gradient coils in order to activate a dynamic magnetic field gradient during acquisition of said magnetic resonance data;

said processor being configured, for said magnetic resonance control sequence, to define an image basis with image basis vectors dependent on anatomy of the examination subject, from which anatomy said magnetic resonance data are to be acquired, and to define a gradient basis with gradient basis vectors conforming to a physical structure and orientation of said gradient coil in said scanner, wherein said dynamic magnetic field gradient proceeds along one of said image basis vectors;

said processor being configured to implement a basis transformation of the dynamic magnetic field gradient from the image basis into the gradient basis, and thereby generate a transformed magnetic field gradient;

said processor being configured to optimize the transformed magnetic field gradient in the gradient basis based on a pre-set optimization criterion, and thereby generate an optimized magnetic field gradient; and being configured to emit an optimized magnetic resonance control sequence, which comprises the optimized magnetic field gradient, from the processor as an electronic signal formatted to control said magnetic resonance data acquisition scanner to execute the optimized magnetic resonance control sequence.

10. A non-transitory, computer-readable data storage medium encoded with programming instructions, said storage medium being loaded into a computer of a magnetic resonance apparatus that comprises a magnetic resonance data acquisition scanner, comprising a set of gradient coils, said programming instructions causing said control computer to:

receive a magnetic resonance control sequence, to be used to operate said magnetic resonance data acquisition scanner so as to acquire magnetic resonance data from an examination subject, said magnetic resonance control sequence causing said data acquisition scanner to operate the set of gradient coils in order to activate a dynamic magnetic field gradient during acquisition of said magnetic resonance data;

for said magnetic resonance control sequence, define an image basis with image basis vectors dependent on anatomy of the examination subject, from which anatomy said magnetic resonance data are to be acquired, and define a gradient basis with gradient basis vectors conforming to a physical structure and orientation of said gradient coil in said scanner, wherein said dynamic magnetic field gradient proceeds along one of said image basis vectors;

implement a basis transformation of the dynamic magnetic field gradient from the image basis into the gradient basis, and thereby generate a transformed magnetic field gradient;

optimize the transformed magnetic field gradient in the gradient basis based on a pre-set optimization criterion, and thereby generate an optimized magnetic field gradient; and emit an optimized magnetic resonance control sequence, which comprises the optimized magnetic field gradient, from the processor as an electronic signal formatted to control said magnetic resonance data acquisition scanner to execute the optimized magnetic resonance control sequence.

* * * * *